(12) United States Patent
Hu et al.

(10) Patent No.: US 9,070,557 B2
(45) Date of Patent: Jun. 30, 2015

(54) METHOD OF FORMING DOUBLE PATTERN IN A STRUCTURE

(71) Applicant: SEMICONDUCTOR MANUFACTURING INTERNATIONAL CORP., Shanghai (CN)

(72) Inventors: Daniel Hu, Shanghai (CN); Ken Wu, Shanghai (CN); Yiming Gu, Shanghai (CN)

(73) Assignee: SEMICONDUCTOR MANUFACTURING INTERNATIONAL CORP., Shanghai (CN)

( * ) Notice: Subject to any disclaimer, the term of this patent is extended or adjusted under 35 U.S.C. 154(b) by 258 days.

(21) Appl. No.: 13/787,869

(22) Filed: Mar. 7, 2013

(65) Prior Publication Data

US 2013/0234294 A1 Sep. 12, 2013

(30) Foreign Application Priority Data

Mar. 9, 2012 (CN) .......................... 2012 1 0062205

(51) Int. Cl.
| | |
|---|---|
| *H01L 21/00* | (2006.01) |
| *H01L 33/00* | (2010.01) |
| *H01L 21/027* | (2006.01) |
| *H01L 29/06* | (2006.01) |
| *H01L 21/311* | (2006.01) |
| *H01L 23/532* | (2006.01) |
| *H01L 21/768* | (2006.01) |
| *H01L 23/522* | (2006.01) |

(52) U.S. Cl.
CPC ............ *H01L 21/0274* (2013.01); *H01L 29/06* (2013.01); *H01L 21/31144* (2013.01); *H01L 23/53295* (2013.01); *H01L 23/5226* (2013.01); *H01L 21/76802* (2013.01); *H01L 23/5329* (2013.01)

(58) Field of Classification Search
CPC ..................... H01L 21/31144; H01L 21/0274; H01L 21/76832; H01L 21/78602; H01L 29/06; H01L 23/53295; H01L 23/5226; H01L 23/5329
See application file for complete search history.

(56) References Cited

U.S. PATENT DOCUMENTS

| | | | | |
|---|---|---|---|---|
| 5,885,750 | A * | 3/1999 | Hsiao et al. ..................... | 430/314 |
| 8,853,093 | B2 * | 10/2014 | Hu et al. ........................ | 438/708 |
| 2008/0261150 | A1* | 10/2008 | Tsubaki et al. ............. | 430/270.1 |
| 2009/0111058 | A1* | 4/2009 | Ahn .............................. | 430/312 |
| 2010/0062380 | A1 | 3/2010 | Takemura et al. | |
| 2010/0068654 | A1* | 3/2010 | Fonseca et al. ............... | 430/322 |
| 2011/0070738 | A1* | 3/2011 | Liang et al. ................... | 438/702 |
| 2011/0195576 | A1* | 8/2011 | Ko et al. ........................ | 438/702 |
| 2011/0305992 | A1* | 12/2011 | Tarutani et al. ............... | 430/319 |
| 2012/0077131 | A1* | 3/2012 | Enomoto et al. .............. | 430/325 |

* cited by examiner

*Primary Examiner* — Alonzo Chambliss
(74) *Attorney, Agent, or Firm* — Anova Law Group, PLLC (57) ABSTRACT

A semiconductor structure including a double patterned structure and a method for forming the semiconductor structure are provided. A negative photoresist layer is formed on a positive photoresist layer, which is formed over a substrate. An exposure process is performed to form a first exposure region in the positive photoresist layer and to form a second exposure region in the negative photoresist layer in response to a first and a second intensity thresholds of the exposure energy. A negative-tone development process is performed to remove portions of the negative photoresist layer to form first opening(s). The positive photoresist layer is then etched along the first opening(s) to form second opening(s) therein. A positive-tone development process is performed to remove the first exposure region therefrom to form a double patterned positive photoresist layer.

20 Claims, 7 Drawing Sheets

FIG. 1

(Prior Art)

FIG. 2

(Prior Art)

FIG. 3

(Prior Art)

FIG. 4

(Prior Art)

FIG. 5

(Prior Art)

FIG. 6

(Prior Art)

FIG. 7

(Prior Art)

METHOD OF FORMING DOUBLE PATTERN IN A STRUCTURE

CROSS REFERENCE TO RELATED APPLICATIONS

This application claims priority to Chinese patent application No. CN201210062205.3, filed on Mar. 9, 2012, and entitled "METHOD FOR FORMING SEMICONDUCTOR STRUCTURE", the entire disclosure of which is incorporated herein by reference.

FIELD OF THE DISCLOSURE

The present disclosure generally relates to the field of semiconductor manufacturing and, more particularly, to a double patterned structure and a method for forming the double patterned structure.

BACKGROUND OF THE DISCLOSURE

In semiconductor device manufacturing, lithographic and etching processes are repeatedly performed to form patterned structures. For example, a photoresist layer may be firstly formed on a substrate to be processed, then exposure and development processes are performed to form openings in the photoresist layer. The substrate is exposed through the openings. Thereafter, the substrate is etched by using the patterned photoresist layer as a mask to form a desired pattern in the substrate.

In the development process, portions of the photoresist are exposed by light penetrating through a photo mask and the chemical characteristics of the exposed portions of the photoresist layer may be changed. In a case that a positive photoresist layer is used, the exposed portions are altered from insoluble to soluble. In a case that a negative photoresist layer is used, the exposed portions are altered from soluble to insoluble. Therefore, some portions of the photoresist layer are removed in the development process and the pattern on the photo mask is transferred onto the photoresist layer.

In a practical manufacturing process, the smallest distance between two neighboring components of a final device (the distance is named as "pitch") depends on a resolution ratio of the exposure system. The smaller the ratio is, the smaller the pitch can be. With smaller pitch, semiconductor devices can be better integrated.

Conventional methods for reducing a pitch in a semiconductor device include use of a double patterning technology, which includes litho-etch-litho-etch (LELE) processes and dual-tone development (DDT) processes.

In a LELE process, two lithographic processes and two etching processes must be performed to one substrate to form a pattern thereon. Although the pitch between two neighboring components in the pattern may be obtained smaller, processing complexity is added because two lithographic processes and two etching processes must be performed.

In a DDT process, a photoresist layer is formed on a substrate and then exposed to form a dual pattern. Then, a positive-tone development and a negative-tone development are performed to the photoresist layer having the dual pattern therein. Such process is difficult to control because the positive-tone development and the negative-tone development may affect each other.

Therefore, there is a need to provide a double patterned structure and a simplified method for forming the double patterned structure with easy control of formation.

SUMMARY

According to various embodiments, there is provided a method for forming a semiconductor structure. The semiconductor structure can be formed by forming a positive photoresist layer over a substrate and forming a negative photoresist layer on the positive photoresist layer. An exposure process can be performed to form a first exposure region in the positive photoresist layer and a second exposure region in the negative photoresist layer. A negative-tone development process can be performed to remove portions of the negative photoresist layer outside of the second exposure region to form one or more first openings to expose the positive photoresist layer. The positive photoresist layer can be etched along the one or more first openings to form one or more second openings through both the negative photoresist layer and the positive photoresist layer to expose the substrate. The second exposure region of the negative photoresist layer can be removed and a positive-tone development process can be performed to remove portions of the positive photoresist layer in the first exposure region to form a double patterned positive photoresist layer.

According to various embodiments, there is also provided a semiconductor structure. The semiconductor structure can include a substrate and a double patterned positive photoresist layer disposed over the substrate. The double patterned positive photoresist layer can be formed by forming a positive photoresist layer over a substrate and forming a negative photoresist layer on the positive photoresist layer. An exposure process can be performed to form a first exposure region in the positive photoresist layer and a second exposure region in the negative photoresist layer. A negative-tone development process can be performed to remove portions of the negative photoresist layer outside of the second exposure region to form one or more first openings to expose the positive photoresist layer. The positive photoresist layer can be etched along the one or more first openings to form one or more second openings through both the negative photoresist layer and the positive photoresist layer to expose the substrate. The second exposure region of the negative photoresist layer can be removed and a positive-tone development process can be performed to remove portions of the positive photoresist layer in the first exposure region to form the double patterned positive photoresist layer.

The disclosed method requires one exposure process and one photo mask. Manufacturing cost can be saved. In the one exposure process, a first exposure region and a second exposure region are respectively formed in the positive photoresist layer and the negative photoresist layer. A pattern of the negative photoresist layer is transferred to the positive photoresist layer by an etching process, and a pattern of the positive photoresist layer is formed by removing the first exposure region therefrom in a development process. Therefore, a double patterned structure is formed in the positive photoresist layer. The process is simple with high accuracy. In addition, because development processes are respectively performed to the negative photoresist layer and the positive photoresist layer, there are no interactions between the development processes. Such process is easy to control with good topography for the formed double pattern.

In some embodiments, removing the remaining negative photoresist layer, e.g., by a negative-tone development process or other suitable processes, and etching the positive photoresist layer along the first openings are performed simultaneously. Processing steps and manufacturing costs can further be reduced.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or like parts. For illustration purposes, elements illustrated in the accompanying drawings are not drawn to scale, which are not intended to limit the scope of the present disclosure. In practical operations, each element in the drawings has specific dimensions such as a length, a width, and a depth.

FIGS. 1-7 are cross-sectional views of intermediate structures illustrating a current litho-etch-litho-etch (LELE) process for forming a double patterned structure.

Figure 1:
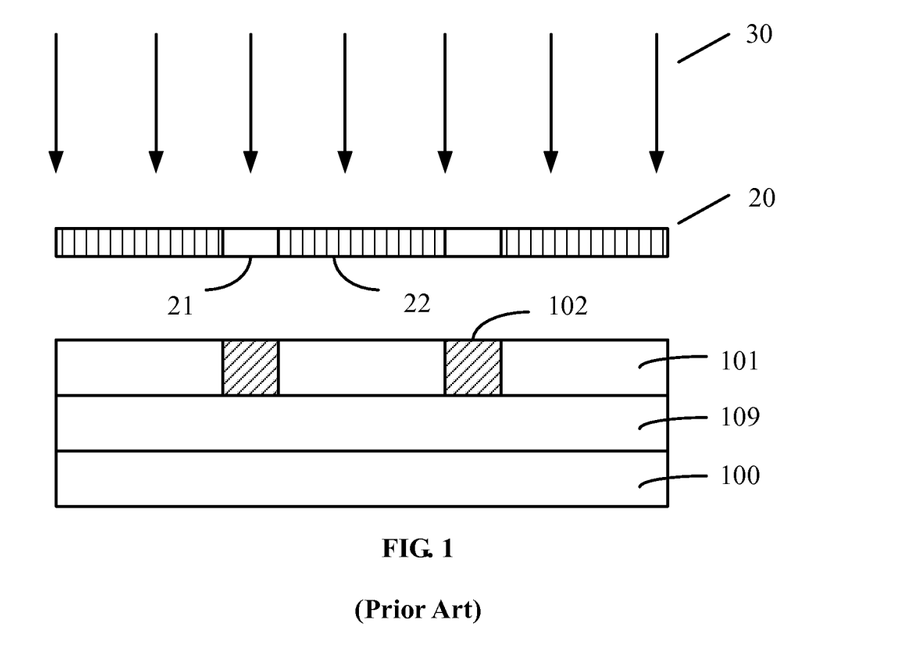
FIGS. 1-7 are cross-sectional views of intermediate structures illustrating a current LELE process for forming a double patterned structure.

Referring to FIG. 1, a substrate 100 is provided. A target layer 109 is formed on the substrate 100. A first photoresist layer 101 is formed on the target layer 109. A first photo mask 20 with a nonopaque part 21 and an opaque part 22 is provided. Exposure light 30 penetrates through the nonopaque part 21 to expose the first photoresist layer 101 to form a first exposure region 102 therein.

Figure 2:
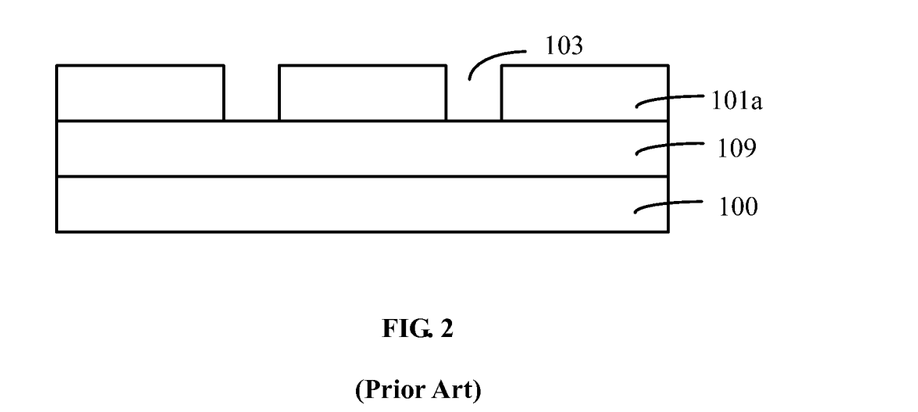

Referring to FIG. 2, a first photoresist layer 101a having one or more first openings 103 is formed, after a first development process is performed to remove the first exposure region 102 (shown in FIG. 1).

Figure 3:
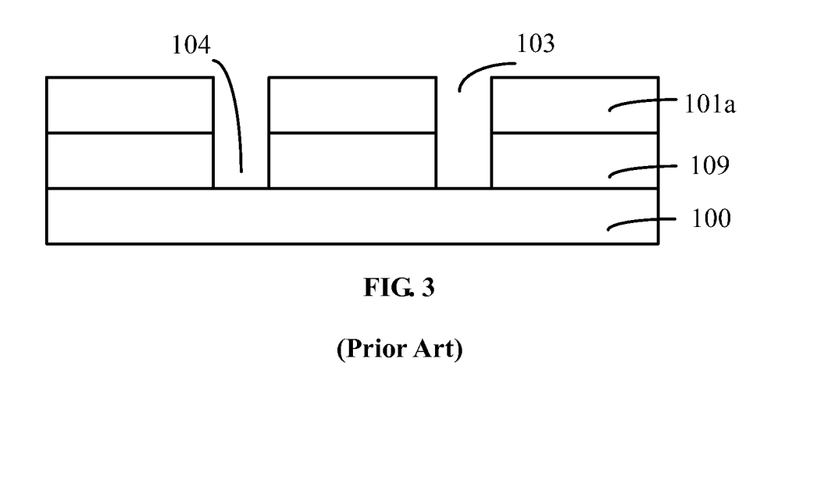

Referring to FIG. 3, the target layer 109 is etched along the first openings 103 using the first photoresist layer 101a as a mask to form one or more second openings 104.

Figure 4:
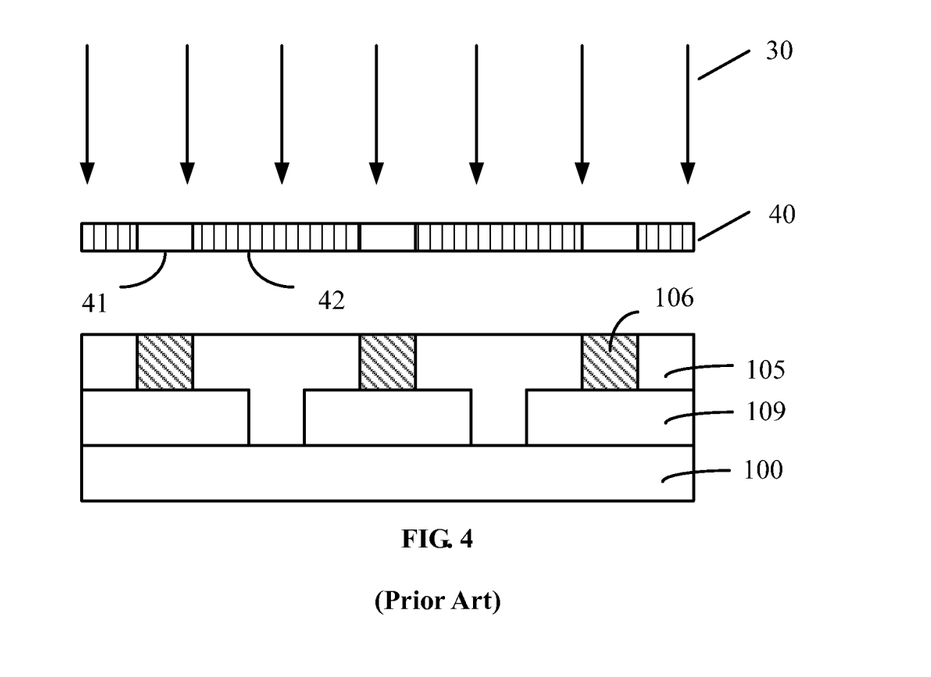

Referring to FIG. 4, the first photoresist layer 101a (shown in FIG. 3) is removed. A second photoresist layer 105 is formed on the target layer 109 and the substrate 100. A second photo mask 40 with a nonopaque part 41 and an opaque part 42 is provided. The exposure light 30 penetrates through the nonopaque part 41 to expose the second photoresist layer 105 to form a second exposure region 106 therein.

Figure 5:
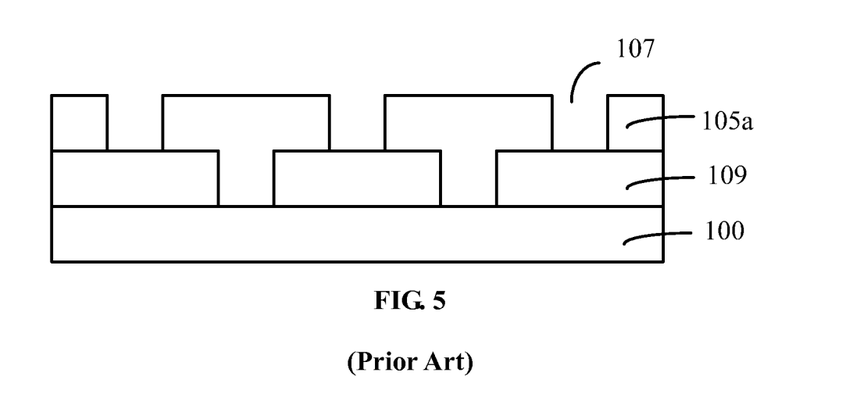

Referring to FIG. 5, a second photoresist layer 105a having one or more third openings 107 is formed after a second development process is performed to remove the second exposure region 106 (shown in FIG. 4).

Figure 6:
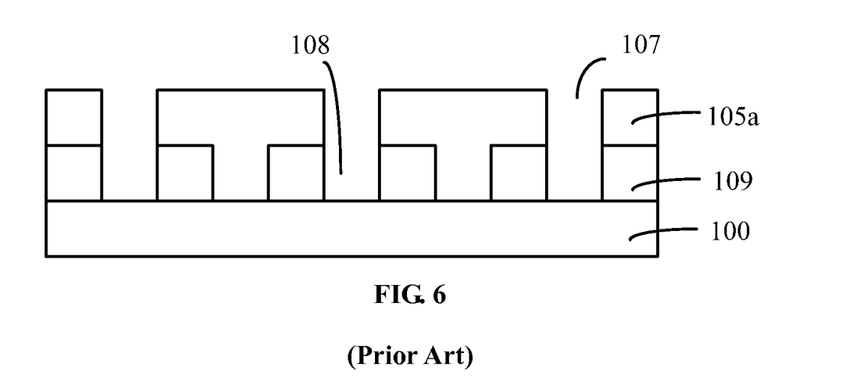

Referring to FIG. 6, the target layer 109 is etched along the third openings 107 using the second photoresist layer 105a as a mask to form one or more fourth openings 108 in the target layer 109.

Figure 7:
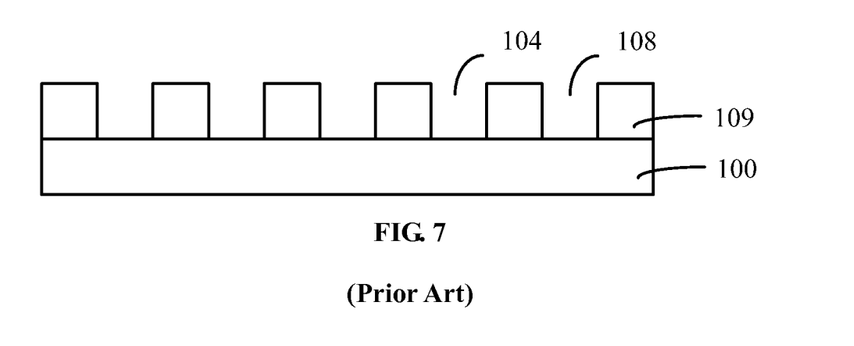

Referring to FIG. 7, the second photoresist layer 105a (shown in FIG. 6) is removed. As such, by employing the LELE process, a double patterned layer is obtained by performing two lithographic processes and two etching processes. However, the process is complex and expensive.

A simplified method for forming a double patterned structure is provided. In the method, a substrate is provided and a positive photoresist layer is formed over the substrate. A negative photoresist layer is then formed over the positive photoresist layer. An exposure process is performed to expose the negative photoresist layer and the positive photoresist layer with an exposure energy having a first intensity threshold and a second intensity threshold. The first intensity threshold is higher than the second intensity threshold. A first exposure region is formed in the positive photoresist layer in response to the exposure energy having the first intensity threshold, and a second exposure region is formed in the negative photoresist layer in response to the exposure energy having the second intensity threshold. The second exposure region is wider than the first exposure region. Thereafter, a first development process is performed to remove portions of the negative photoresist layer outside of the second exposure region to form first openings to expose the positive photoresist layer. The positive photoresist layer is etched along the first openings to form second openings to expose the substrate. The remaining negative photoresist layer in the first development process is removed. And then, a second development process is performed to remove portions of the positive photoresist layer in the first region. A double patterned positive photoresist layer is formed.

The disclosed method requires one exposure process and one photo mask, which saves cost in manufacturing. In addition, because development processes are respectively performed to the negative photoresist layer and the positive photoresist layer without affecting one another, the process is easy to control. This is beneficial for obtaining a double patterned structure with good topography.

Figure 8:
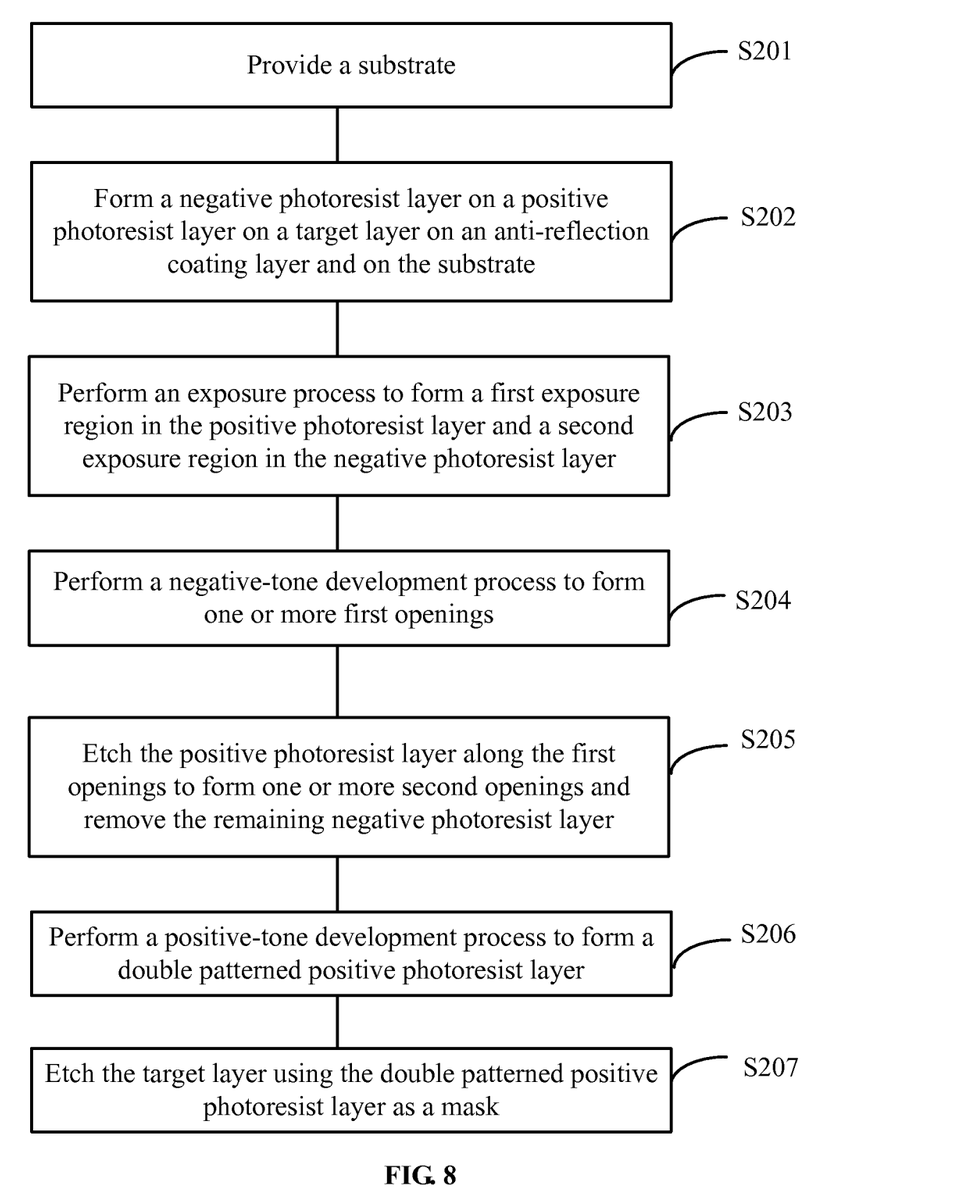
FIG. 8 is a flow chart of an exemplary method for forming a double patterned structure according to various disclosed embodiments.

FIG. 8 is a flow chart of an exemplary method for forming a double patterned structure according to various disclosed embodiments. The exemplary method depicted in FIG. 8 is illustrated herein in detail with reference to the accompanying drawings, including, e.g., FIGS. 9-16. Specifically, FIGS. 9-16 are cross-sectional views of intermediate structures illustrating a process for forming a double patterned structure according to various disclosed embodiments.

Figure 9:
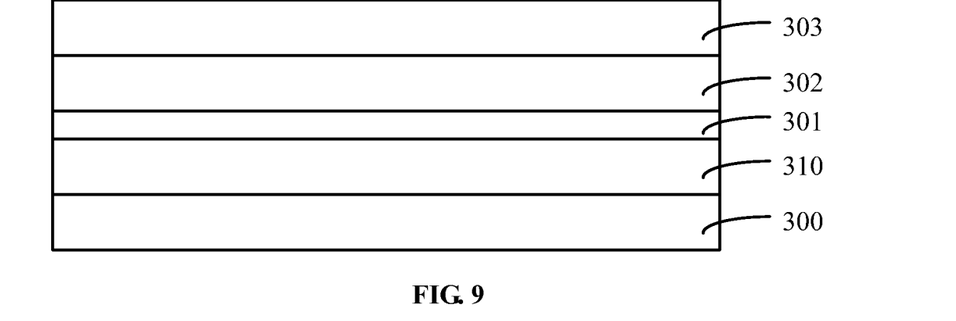
FIGS. 9-16 are cross-sectional views of intermediate structures illustrating a process for forming a double patterned structure according to various disclosed embodiments.

In Step S201 of FIG. 8 and referring to FIG. 9, a substrate 300 is provided.

The substrate 300 may include monocrystalline silicon, monocrystalline germanium, GeSi, SiC, and/or III-V group compounds such as GaAs, InP, or the like. For example, the substrate 300 may be a silicon-on-insulator (SOI) substrate or a germanium-on-insulator (GOI) substrate. Specifically, semiconductor devices may be formed on the substrate 300 including, for example, MOS transistors, diodes, capacitances, inductances, and the like.

In Step S202 of FIG. 8 and still referring to FIG. 9, a target layer 310, an anti-reflection coating (ARC) layer 301, a positive photoresist layer 302, and a negative photoresist layer 303 are successively formed on the substrate 300 as shown in FIG. 9.

The target layer 310 is formed on a top surface of the substrate 300. The target layer 310 may include an insulating material including, for example, silicon dioxide, silicon nitride, silicon carbide, silicon oxynitride, and/or the like. Alternatively, the target layer 310 may include a conductive or semi-conductive material including, for example, metal, metal oxide, metal nitride, metal oxynitride, metal silicide, silicon, polysilicon, and/or the like. Of course, the target layer 310 may include any other suitable materials.

The target layer 310 may include a single-layer structure or a multi-layer stack structure. The target layer 310 may include at least one of the conductive material and/or the insulating material.

The ARC layer 301 is formed on the target layer 310 by applying a spin-on process or a deposition process. The ARC layer 301 may have a thickness in a range from about 100 Å to about 1500 Å. The ARC layer 301 is adapted for eliminating standing wave effect, which may occur in a subsequent exposure process as a result of the optical reflection and optical interference. This allows subsequent-formed photoresist layers to have desired topography, e.g., for sidewalls.

The ARC layer 301 may be an organic ARC layer or an inorganic ARC layer. The inorganic ARC layer includes materials such as Ti, titanium oxide, titanium nitride, chromium oxide, carbon, amorphous silicon, silicon nitride, silicon nitride oxide, silicon carbon, and/or the like. The organic ARC layer includes photo-absorption materials and/or polymer materials. In some cases, the organic ARC layer may include silicon. In one embodiment, the ARC layer 301 is a bottom anti-reflection coating (BARC) layer.

The positive photoresist layer 302 is formed on the ARC layer 301 and the negative photoresist layer 303 is formed on the positive photoresist layer 302. The negative photoresist layer 303 has a thickness in a range from about 500 Å to about 3000 Å. The positive photoresist layer 302 has a thickness in a range from about 500 Å to about 3000 Å.

Each of the negative photoresist layer 303 and the positive photoresist layer 302 is formed by, e.g., applying a spin-on process, in a same process or a different processes. Specifically, the spin-on process is performed as follows. The positive photoresist layer 302 is coated on the ARC layer 301 in a coating chamber; then, a first post application baking (PAB) process is performed to bake the positive photoresist layer 302 to remove some solvent thereof; then, the negative photoresist layer 303 is coated on the positive photoresist layer 302; and then, a second PAB process is performed to the negative photoresist layer 303 to remove some solvent thereof. In each PAB process, the temperature is controlled within a range from about 50° C. to about 200° C. for a processing time within a range from about 20 seconds to about 200 seconds. After each PAB process, the substrate 300 can be cooled to the room temperature.

In various embodiments, prior to coating the positive photoresist layer 302 on the ARC layer 301, the substrate 300 and the ARC layer 301 are dehydrated in order to enhance the adhesion between the ARC layer 301 and the positive photoresist layer 302. This dehydration may be performed by treating the substrate 300 with hexamethyldisilazane gas in a high temperature environment.

The positive photoresist layer 302 may include, e.g., a resin, a photo acid generator (PAG), a base quencher, a solvent, an additive, and/or the like. The negative photoresist layer 303 may include a radiation-induced cross-linking negative resist, a radiation-induced polymerization negative resist, and/or a radiation-induced polarity change negative resist.

Figure 10:
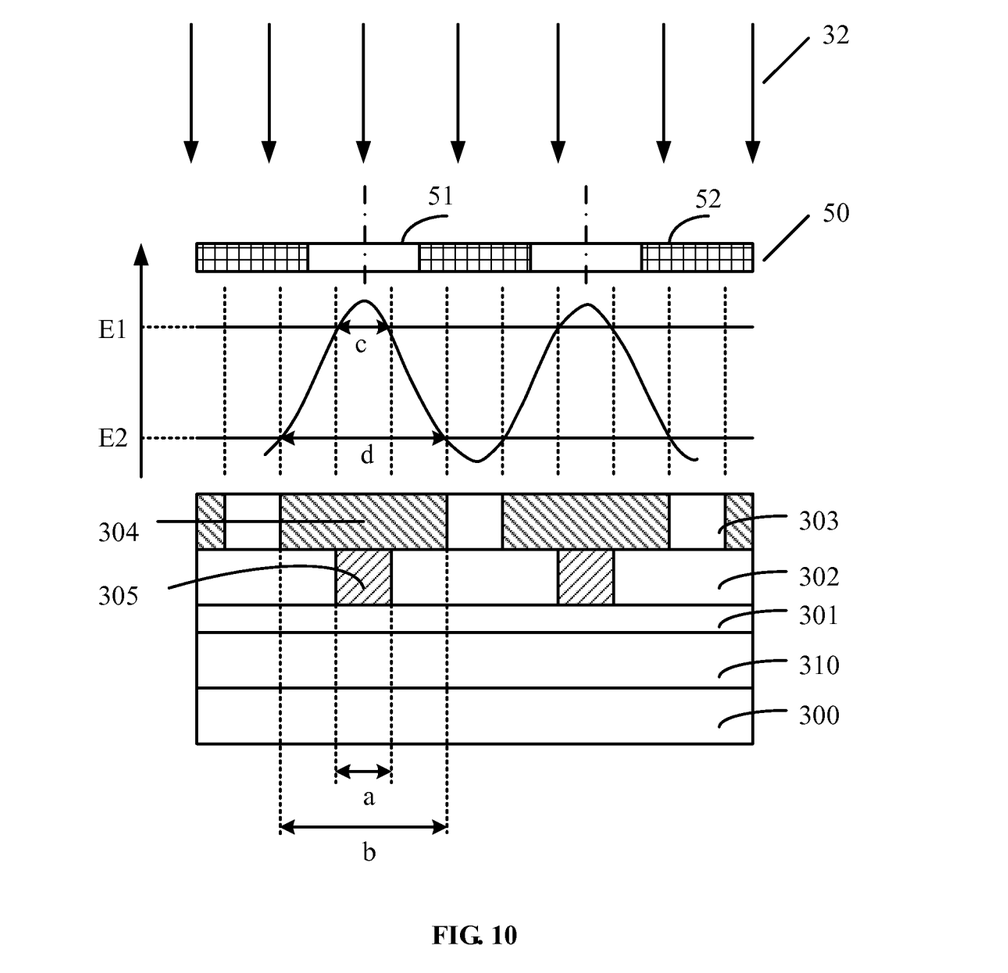

In Step S203 of FIG. 8 and referring to FIG. 10, an exposure process is performed to expose the negative photoresist layer 303 and the positive photoresist layer 302.

As shown in FIG. 10, a photo mask 50 is provided, exposure light 32 generated from an exposure system penetrates through portions of the photo mask 50 to expose the negative photoresist layer 303 and the positive photoresist layer 302. The exposure light 32 is configured to have a first intensity threshold E1 and a second intensity threshold E2 lower than E1. Under the influence of E1, a first exposure region 305 is formed in the positive photoresist layer 302. Under the influence of E2, a second exposure region 304 is formed in the negative photoresist layer 303. The second exposure region 304 has a width "b" is larger than a width "a" of the first exposure region 305. The first exposure region 305 is under the second exposure region 304.

Specifically, the photo mask 50 has a nonopaque part 51 and an opaque part 52. The exposure light 32 generated from the exposure system penetrates through the nonopaque part 51 to expose the positive photoresist layer 302 and the negative photoresist layer 303.

In various embodiments, DUV (i.e., deep ultra violet) light, such as Krf excimer leaser (wave length: 248 nm), Arf excimer leaser (wave length: 193 nm), or the like, can be utilized as the exposure light 32. $F_2$ leaser (wave length: 157 nm), EUV (i.e., extreme ultra-violet) light (wave length: about 13.5 nm), or ultra violet glow generated from ultra pressure mercury lamps such as g-beam, i-beam, and the like, may also by utilized as the exposure light 32.

After the exposure light 32 penetrates through the nonopaque part 51 of the photo mask 50, the exposure energy in a space between the substrate 300 and the photo mask 50 may include a sinusoidal distribution. Within a flat surface parallel to a surface of the substrate 300, the closer to a central axis of the nonopaque part 51 central axis, the higher exposure energy may be as shown in FIG. 10. The exposure energy may reach a maximum value near the central axis of the nonopaque part 51. And due to the boundary effect of the opaque part 52, the exposure energy may degrade when departing from the central axis the nonopaque part 51, and reach a minimum value near a central axis of the opaque part 52.

The distribution of the exposure energy after the exposure light 32 penetrates through the photo mask 50 can be adjusted by tweaking power of the light source and/or the critical dimensions of the opaque part 52 and the nonopaque part 51.

On the energy distribution curve as shown in FIG. 10, a relatively high value is selected as the first intensity threshold E1, which may range from about 70% to about 90% of a maximum value of the exposure energy; and a relatively low value is selected as the second intensity threshold E2, which may range from about 10% to about 40% of the maximum value of the exposure energy. For example, a ratio of E1 to E2 ranges from about 5:1 to about 2:1.

The exposure light 32 penetrates through the nonopaque part 51 to expose the negative photoresist layer 303 to form the second exposure region 304 in the negative photoresist layer 303. Chemical reactions may occur in the negative photoresist layer 303 in response to exposure energy greater than or equal to E2. If the energy is lower than E2, the chemical reactions do not occur. For example, cross-linking reactions may occur in a radiation-induced cross-linking negative resist. Alternatively, polymerization reactions may occur in the radiation-induced polymerization negative resist. Therefore, the second exposure region 304, which is intrinsic soluble, are changed to be insoluble. The insoluble second exposure region 304 cannot be removed by a negative-tone development, while other portions in the negative photoresist layer 303, which are not exposed, can be removed by the negative-tone development. The width "b" of the second exposure region 304 equals to a width "d" of the distribution curve corresponding to the second intensity threshold E2, as shown in FIG. 10.

The exposure light 32 penetrates through the nonopaque part 51 to expose the positive photoresist layer 302 to form the first exposure region 305 in the positive photoresist layer 302. As described above, the positive photoresist layer 302 includes a resin, a photo acid generator (PAG), a base quencher, a solvent, an additive, and/or the like. For example, the PAG may generate a photo acid when exposed to an exposure energy greater or equal to E1. If the exposure energy is lower than E1, the PAG does not generate photo acid. The generated photo acid reacts with the resin in the positive photoresist layer 302, which changes the first exposure region 305 from an intrinsic insoluble status to a soluble status. Therefore, the first exposure region 305 can be removed by a positive-tone development. The base quencher in the positive photoresist layer 302 is adapted for controlling the reaction (e.g., terminating the reaction) between the photo acid and the resin in the positive photoresist layer 302. The width "a" of the first exposure region 305 equals to a width "c" of the distribution curve corresponding to the first intensity threshold E1, as shown in FIG. 10.

In this manner, the chemical reaction in the negative photoresist layer 303 to form the second exposure region 304 therein may occur in response to the exposure energy greater than or equal to E2. The photo acid (along with its chemical reaction) in the positive photoresist layer 302 may be generated in response to the exposure energy greater than or equal to E1. E2 is lower than E1. On the distribution curve shown in FIG. 10, the width "d" corresponding to E2 is greater than the width "c" corresponding to E1. Therefore, after the exposure, the width "b" of the second exposure region 304 is greater than the width "a" of the first exposure region 305.

For example, the second exposure region 304 may have the width "b" approximately 1.5 times to 4.5 times (e.g., about 3 times) of the width "a" of the first exposure region 305. The widths of the exposure regions can be easily adjusted as desired. For example, when E1 and E2 are predetermined, the distribution of the exposure energy can be adjusted by adjusting power of the light source and/or the critical dimensions of the opaque part 52 and the nonopaque part 51. The widths on the distribution curve respectively corresponding to E1 and E2 can be adjusted. Thus, the second exposure region 304 and the first exposure region 305 may have desired widths after exposure.

In an exemplary embodiment, the second exposure region 304 may have the width "b" of about 3 times of the width "a" of the first exposure region 305, so that a double patterned positive photoresist layer including components with the same linear widths and pitches may be obtained.

In another exemplary embodiment, the second exposure region 304 may have the width "b" of less than about 3 times of the width "a" of the first exposure region 305, so that the linear widths of the components may be smaller and the pitches may be larger. To the contrary, in another exemplary embodiment, the second exposure region 304 may have the width "b" of more than 3 times of the width "a" of the first exposure region 305, so that the linear widths of the components may be larger and the pitches may be smaller.

After the exposure process, a post exposure baking (PEB) process may be performed to the positive photoresist layer 302 and the negative photoresist layer 303 to further control widths of the exposure regions and eliminate the standing wave effect.

In the PEB process, the temperature is controlled within a range from about 50° C. to about 200° C. for a processing time within a range from about 15 seconds to about 200 seconds. After the PEB process, the substrate 300 can be cooled to the room temperature.

Figure 11:
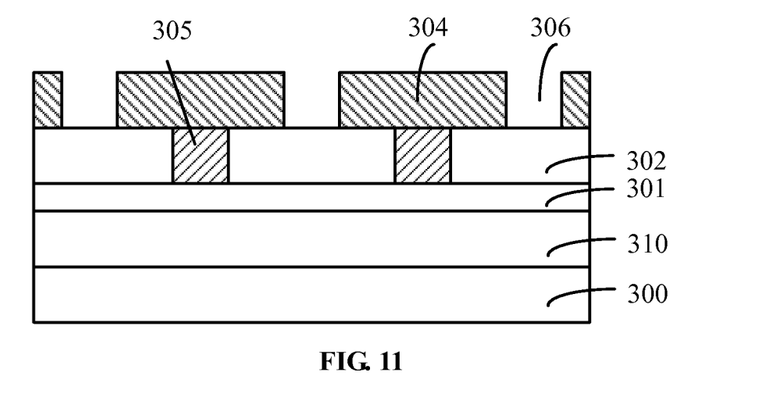

In Step S204 of FIG. 8 and referring to FIG. 11, a negative-tone development process is performed to remove a portion of the photo resist material from the negative photoresist layer 303 (shown in FIG. 10) to form one or more first openings 306 outside of the second exposure region 304. The first openings 306 expose the positive photoresist layer 302.

The negative-tone development process utilizes an organic solution as the developer which is also referred to as organic developer. The second exposure region 304 is insoluble in the organic developer, while other portions of the negative photoresist layer 303 are soluble in the organic developer and are removed to form the first openings 306.

The organic developer includes one or more solvents selected from: a ketone solvent, such as octanon and the like; an ester solvent, such as butyl acetate, amyl acetate, Ethyl 3-Ethoxypropionate, butyl formate, propyl formate, and the like; an alcohol solvent, such as n-propyl alcohol, isopropyl alcohol, butyl alcohol, hexyl alcohol, heptyl alcohol, octyl alcohol, and the like; and a glycol ether solvent, such as ethylene glycol monomethyl ether, ether solvent, and the like. In an embodiment, the organic developer may further include surfactant.

After the negative-tone development process, the substrate 300 may be rinsed, e.g., using any suitable organic solutions. After the negative-tone development process, a thermal treatment may be performed to the substrate 300 to remove remaining water and solution therefrom to further enhance the adhesion between the negative photoresist layer and the underlying layer.

The negative-tone development process may also use aqueous alkali solution as the developer, which is also referred to as aqueous alkali developer. Similarly, the second exposure region 304 is insoluble in the aqueous alkali developer and the other portions of the negative photoresist layer 303 are soluble in the aqueous alkali developer and are removed to form the first openings 306.

In various embodiment, alkali materials in the aqueous alkali developer may include one or more materials selected from: sodium hydroxide; potassium hydroxide; sodium carbonate; sodium silicate; sodium metasilicate; aqueous ammonia; primary amines such as ethylamine and/or n-propylamine; secondary amines such as diethylamine; tertiary amine such as triethylamine; alcoholamine such as dimethylethano; quaternary ammonium salt such as tetramethylammonium hydroxide (TMAH) and tetraethylammonium hydroxide (TEAH); and/or cyclic amine In one embodiment, the aqueous alkali developer is TMAH.

A pH value of the aqueous alkali developer can be within a range from about 9 to about 15. A time length for the negative-tone development process using the aqueous alkali developer can be within a range from about 10 seconds to about 300 seconds. After the development, the substrate 300 is rinsed with purified water.

In an exemplary embodiment, the negative photoresist layer 303 includes a radiation-induced polymerization negative resist or a radiation-induced polarity change negative resist and the negative-tone development process uses an organic developer, accordingly. In another exemplary embodiment, the negative photoresist layer 303 includes a radiation-induced cross-linking negative resist and the negative-tone development process uses the organic developer or the aqueous alkali developer, accordingly.

It is noted that the negative-tone development process, by either the organic developer or the aqueous alkali developer, does not affect the positive photoresist layer 302 underlying the negative photoresist layer 303.

Figure 12:
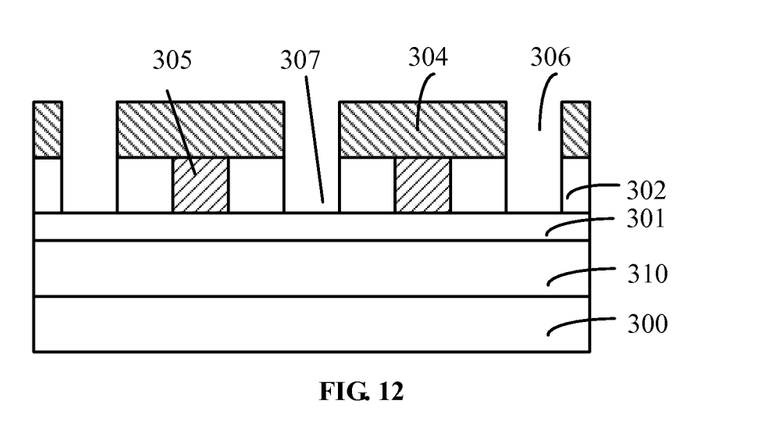
Figure 13:
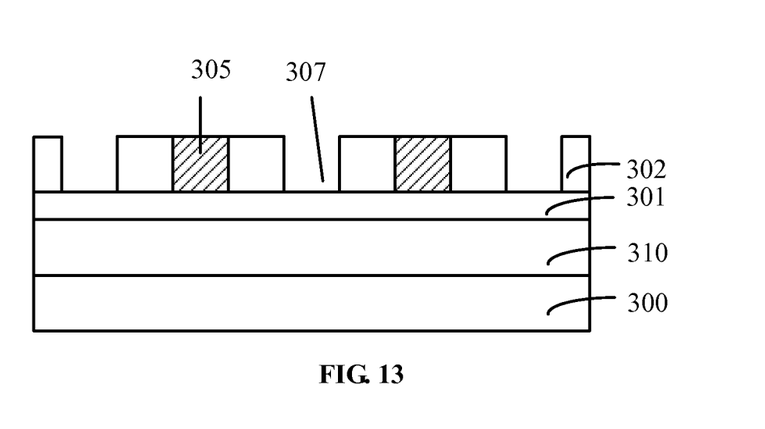

In Step S205 of FIG. 8 and referring to FIGS. 12-13, the positive photoresist layer 302 is etched using the second exposure region 304 as a mask to form one or more second openings 307. The second openings 307 are formed through the positive photoresist layer 302 and expose the ARC layer 301. Thereafter, the remaining negative photoresist layer (i.e., the second exposure region 304) is removed as shown in FIG. 13.

Etching the positive photoresist layer 302 to form the second openings 307 may be performed by, e.g., a reactive ion etching process using oxygen as an etching gas. In an embodiment, the etching gas further includes an inert gas including, such as, for example, He, Ne, $N_2$, Ar, Xe, or a combination thereof.

In an embodiment, removing the remaining negative photoresist layer (i.e., the second exposure region 304) and etching the positive photoresist layer 302 to expose the ARC layer 301 may be performed simultaneously in a same etching process. Therefore, processing steps and cost are further reduced. In some cases, to ensure that the ARC layer 301 is exposed through the second openings 307, the positive photoresist layer 302 may be over etched during the etching process. In other exemplary embodiments, the remaining negative photoresist layer may be removed in a separate process from etching the positive photoresist layer 302 to expose the ARC layer 301.

Figure 14:
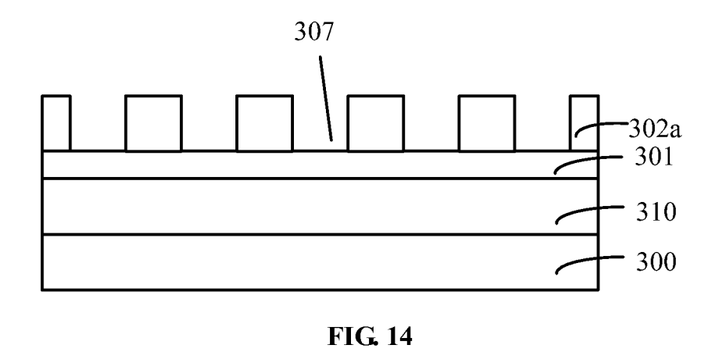

In Step S206 of FIG. 8 and referring to FIG. 14, a positive-tone development process is performed to remove the first exposure region 305 (shown in FIG. 13) to form a double patterned positive photoresist layer 302a shown in FIG. 14.

In the positive-tone development process, the first exposure region 305 is dissolved into the developer while other portions of the positive photoresist layer 302 are insoluble. Therefore, after the positive-tone development process, the first exposure region 305 is removed and the double patterned positive photoresist layer 302a is formed.

In various embodiments, the positive-tone development process may also use the aqueous alkali developer as used in the negative-tone development process. In one embodiment, the aqueous alkali developer includes TMAH. A pH value of the aqueous alkali developer can be within a range from about 9 to about 15. A time length for the positive-tone development process using the aqueous alkali developer can be within a range from about 10 seconds to about 300 seconds.

After development, the substrate 300 is rinsed with purified water. Further, a thermal treatment may be performed to the substrate 300 to remove the remaining water and solution to further enhance adhesion between the positive photoresist layer and underlying layer.

Figure 15:
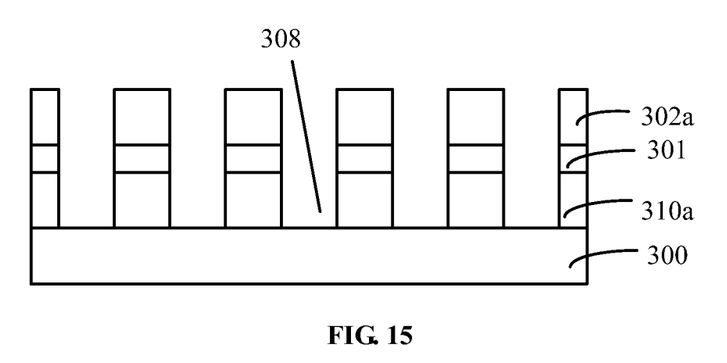
Figure 16:
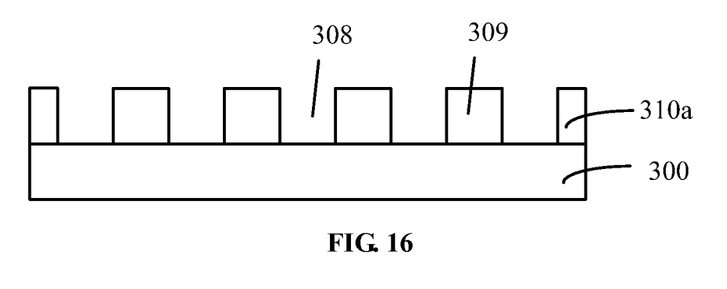

In Step S207 of FIG. 8 and referring to FIGS. 15-16, the ARC layer 301 and the target layer 310 are etched using the double patterned positive photoresist layer 302a as a mask to form a double patterned semiconductor structure having openings 308 as shown in FIG. 15. Remaining ARC layer 301 may then be removed to leave a patterned target layer 310a having a plurality of target layer structures 309 on the substrate 300 as shown in FIG. 16. Any suitable etching techniques can be used to etch and remove the ARC layer 301 and/or the target layer 310.

In this manner, the disclosed method uses one exposure process and one photo mask. Manufacturing cost may be saved. In the one exposure process, a first exposure region and a second exposure region are respectively formed in the positive photoresist layer and the negative photoresist layer. A pattern of the negative photoresist layer is transferred to the positive photoresist layer by an etching process, and a pattern of the positive photoresist layer is formed by removing the first exposure region therefrom in a development process. Therefore, a double patterned structure is formed in the positive photoresist layer. The process is simple with high accuracy. In addition, because development processes are respectively performed to the negative photoresist layer and the positive photoresist layer, there are no interactions between the development processes. Such processes are easily controlled with good topography for the formed double patterned structure.

The embodiments disclosed herein are exemplary only. Other applications, advantages, alternations, modifications, or equivalents to the disclosed embodiments are obvious to those skilled in the art and are intended to be included within the scope of the present disclosure.

What is claimed is:

1. A method for forming a semiconductor structure, comprising:
   providing a substrate;
   forming a positive photoresist layer over the substrate;
   forming a negative photoresist layer on the positive photoresist layer;
   performing an exposure process to form a first exposure region in the positive photoresist layer and a second exposure region in the negative photoresist layer,
      wherein the second exposure region having a second width is located on the first exposure region having a first width, and the first exposure region and the second exposure region have a same central axis according to the exposure process, and wherein the first width is less than the second width;
   performing a negative-tone development process to remove portions of the negative photoresist layer outside of the second exposure region to form one or more first openings to expose the positive photoresist layer;
   etching the positive photoresist layer along the one or more first openings to form one or more second openings through both the negative photoresist layer and the positive photoresist layer;
   removing the second exposure region of the negative photoresist layer; and
   performing a positive-tone development process to remove portions of the positive photoresist layer in the first exposure region to form a double patterned positive photoresist layer.

2. The method according to claim 1, wherein the exposure process provides an exposure energy having a first intensity threshold and a second intensity threshold, the first intensity threshold being greater than the second intensity threshold.

3. The method according to claim 2, wherein: the first exposure region is formed in response to the exposure energy greater than or equal to the first intensity threshold, the second exposure region is formed in response to the exposure energy greater than or equal to the second intensity threshold, and the second exposure region is wider than the first exposure region.

4. The method according to claim 2, wherein the positive photoresist layer comprises a photo acid generator and a resin, the photo acid generator generating a photo acid when the exposure energy is greater than or equal to the first intensity threshold, and the photo acid reacting with the resin in the positive photoresist layer to form the first exposure region.

5. The method according to claim 1, wherein the negative photoresist layer includes a radiation-induced cross-linking negative resist, a radiation-induced polymerization negative resist, or a radiation-induced polarity change negative resist.

6. The method according to claim 1, wherein the second width of the second exposure region is about 1.5 times to about 4.5 times of the first width of the first exposure region.

7. The method according to claim 1, wherein the negative-tone development process uses a developer comprising an organic solution or an aqueous alkali solution, and the second exposure region of the negative photoresist layer is insoluble in the developer and the portions of the negative photoresist layer outside of the second exposure region are soluble in the developer.

8. The method according to claim 1, wherein the positive-tone development process uses a developer comprising an aqueous alkali solution, and the first exposure region of the positive photoresist layer is soluble in the developer and portions of the positive photoresist layer outside of the first exposure region are insoluble in the developer.

9. The method according to claim 1, wherein etching the positive photoresist layer along the one or more first openings comprises a reactive ion etching process, the reactive ion etching process using oxygen as an etching gas.

10. The method according to claim 1, wherein removing the remaining negative photoresist layer and etching the positive photoresist layer along the one or more first openings are performed in a same process.

11. The method according to claim 1, further comprising: performing a post exposure baking process to the substrate after the exposure process.

12. The method according to claim 1, wherein each of the positive photoresist layer and the negative photoresist layer is formed by a spin-on process comprising: forming the positive photoresist layer over the substrate; performing a first post application baking process to bake the positive photoresist layer; forming the negative photoresist layer on the positive photoresist layer; and performing a second post application baking process to bake the negative photoresist layer.

13. A semiconductor structure, comprising:
a substrate; and
a double patterned positive photoresist layer disposed over the substrate, wherein the double patterned positive photoresist layer is formed by:
forming a positive photoresist layer over the substrate;
forming a negative photoresist layer on the positive photoresist layer;
performing an exposure process to form a first exposure region in the positive photoresist layer and a second exposure region in the negative photoresist layer, wherein the second exposure region having a second width is located on the first exposure region having a first width, and the first exposure region and the second exposure region have a same central axis according to the exposure process, and wherein the first width is less than the second width;
performing a negative-tone development process to remove portions of the negative photoresist layer outside of the second exposure region to form one or more first openings to expose the positive photoresist layer;
etching the positive photoresist layer along the one or more first openings to form one or more second openings through both the negative photoresist layer and the positive photoresist layer;
removing the second exposure region of the negative photoresist layer; and
performing a positive-tone development process to remove portions of the positive photoresist layer in the first exposure region to form the double patterned positive photoresist layer.

14. The structure according to claim 13, wherein the exposure process provides an exposure energy having a first intensity threshold and a second intensity threshold, the first intensity threshold being greater than the second intensity threshold.

15. The structure according to claim 14, wherein:
the first exposure region is formed in response to the exposure energy greater than or equal to the first intensity threshold, the second exposure region is formed in response to the exposure energy greater than or equal to the second intensity threshold.

16. The structure according to claim 13, wherein an anti-reflection coating layer is disposed between the substrate and the positive photoresist layer.

17. The structure according to claim 16, wherein the anti-reflection coating layer is an organic anti-reflection coating layer or an inorganic anti-reflection coating layer.

18. The structure according to claim 16, wherein the anti-reflection coating layer has a thickness within a range from about 100 Å to about 1500 Å.

19. The structure according to claim 13, wherein the negative photoresist layer has a thickness in a range from about 500 Å to about 3000 Å, and the positive photoresist layer has a thickness in a range from about 500 Å to about 3000 Å.

20. The structure according to claim 13, further comprising a target layer disposed between the substrate and the positive photoresist layer.

* * * * *